(12) United States Patent
Sekiya et al.

(10) Patent No.: US 8,198,175 B2
(45) Date of Patent: Jun. 12, 2012

(54) PROCESSING METHOD FOR PACKAGE SUBSTRATE

(75) Inventors: Kazuma Sekiya, Ota-Ku (JP); Koichi Kondo, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/023,165

(22) Filed: Feb. 8, 2011

(65) Prior Publication Data
US 2011/0212574 A1 Sep. 1, 2011

(30) Foreign Application Priority Data
Mar. 1, 2010 (JP) .................................. 2010-043663

(51) Int. Cl.
*H01L 21/46* (2006.01)
*H01L 21/78* (2006.01)
*H01L 21/301* (2006.01)

(52) U.S. Cl. ......... 438/460; 257/E21.238; 257/E21.304; 257/E21.599; 438/113; 438/114; 438/459; 438/462; 438/464; 438/465

(58) Field of Classification Search ........... 257/E21.238, 257/E21.304, E21.599; 438/113, 114, 459, 438/460, 462, 464, 465
See application file for complete search history.

(56) References Cited

U.S. PATENT DOCUMENTS
2003/0013233 A1 * 1/2003 Shibata ...................... 438/114

FOREIGN PATENT DOCUMENTS
JP 2008-272866 11/2008
* cited by examiner

*Primary Examiner* — Asok Sarkar
(74) *Attorney, Agent, or Firm* — Greer, Burns & Crain, Ltd.

(57) ABSTRACT

A processing method for a package substrate having a base substrate partitioned by a plurality of crossing division lines to form a plurality of chip forming areas where a plurality of semiconductor chips are respectively formed and molded with resin. The package substrate has a resin surface and an electrode surface opposite to the resin surface. The processing method includes a warp correcting step of cutting the package substrate from the resin surface or the electrode surface along the division lines by using a cutting blade to form a cut groove, thereby correcting a warp of the package substrate, and a grinding step of grinding the resin surface of the package substrate in the condition where the electrode surface of the package substrate is held on a holding table after performing the warp correcting step, thereby reducing the thickness of the package substrate to a predetermined thickness.

3 Claims, 14 Drawing Sheets

PROCESSING METHOD FOR PACKAGE SUBSTRATE

BACKGROUND OF THE INVENTION

1. Field of the Invention

The present invention relates to a processing method for a package substrate having a plurality of semiconductor chips molded with resin.

2. Description of the Related Art

In a semiconductor device fabrication process, a plurality of semiconductor chips each having a circuit such as an LSI are mounted on a leadframe or a printed board, and each electrode is connected by bonding. Thereafter, these semiconductor chips are molded with resin to thereby form a package substrate such as a CSP (Chip Size Package) substrate and a BGA (Ball Grid Array) substrate. Thereafter, the package substrate is diced-cut by using a cutting blade or the like to manufacture a plurality of individual semiconductor devices molded with resin. Such semiconductor devices are widely used for electronic equipment such as a mobile phone and a personal computer.

With a recent reduction in size and thickness of electronic equipment, a reduction in size and thickness of each semiconductor device is also earnestly desired. Therefore, in a semiconductor device fabrication process, there is a desire such that a resin molded surface of the package substrate having the semiconductor chips molded with resin is ground to reduce the thickness of the package substrate. In grinding the package substrate, a grinding apparatus called a grinder as disclosed in Japanese Patent Laid-open No. 2008-272866, for example, is widely used. Such a grinding apparatus includes a holding table for holding a workpiece such as a package substrate under suction and a grinding wheel opposed to the workpiece held on the holding table, wherein the grinding wheel is brought into sliding contact with the workpiece to thereby grind the workpiece.

SUMMARY OF THE INVENTION

However, warp is apt to occur in the package substrate due to the influence of heat in molding the semiconductor chips with resin. In the case of holding under suction such a package substrate having a warp on the holding table of the grinding apparatus, there is a problem such that a vacuum may leak from a nontight contact portion between the package substrate and the holding table, so that the package substrate cannot be held under suction on the holding table and the package substrate cannot therefore be ground.

It is therefore an object of the present invention to provide a package substrate processing method which can grind a package substrate having a warp to manufacture a semiconductor device having a reduced thickness.

In accordance with an aspect of the present invention, there is provided a processing method for a package substrate having a base substrate partitioned by a plurality of crossing division lines to form a plurality of chip forming areas where a plurality of semiconductor chips are respectively formed and molded with resin, the package substrate having a resin surface and an electrode surface opposite to the resin surface, the processing method including a warp correcting step of cutting the package substrate from the resin surface or the electrode surface along the division lines by using a cutting blade to form a cut groove along each division line, thereby correcting a warp of the package substrate; and a grinding step of grinding the resin surface of the package substrate in the condition where the electrode surface of the package substrate is held on a holding table after performing the warp correcting step, thereby reducing the thickness of the package substrate to a predetermined thickness.

Preferably, the warp correcting step includes the step of cutting the package substrate from the electrode surface along the division lines by using the cutting blade to form the cut groove having a depth corresponding to the predetermined thickness. Preferably, the processing method for the package substrate further includes a support member providing step of providing a support member on the electrode surface of the package substrate before performing the warp correcting step, wherein the warp correcting step includes the step of cutting the package substrate from the resin surface along the division lines by using the cutting blade to form the cut groove having a depth reaching the support member.

According to the processing method for the package substrate as described above, the warp of the package substrate is corrected by the cut grooves formed on the package substrate. Accordingly, the package substrate having a warp can be ground in the condition where it is held under suction on the holding table in a grinding apparatus, so that a semiconductor device having a reduced thickness can be manufactured.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Some preferred embodiments of the present invention will now be described in detail with reference to the drawings.

Figure 1:
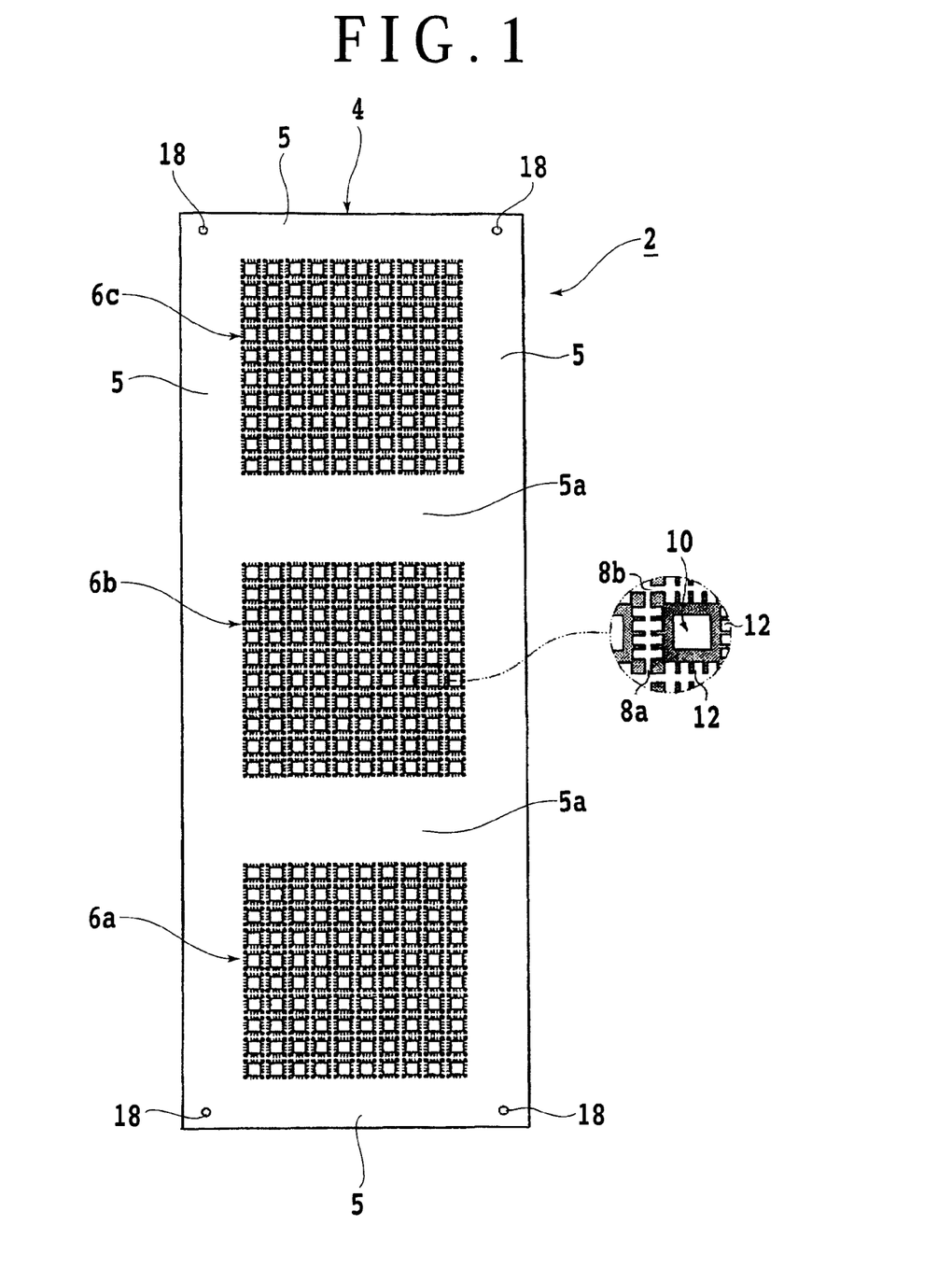
FIG. 1 is a top plan view of a CSP substrate as an example of the package substrate.

Referring to FIG. 1, there is shown a plan view of a package substrate 2 as an object to be processed by the processing method of the present invention. The package substrate 2 is a CSP substrate, and it has a rectangular metal frame 4. The metal frame 4 has a peripheral marginal area 5 and a non-chip area 5a, wherein three chip areas 6a, 6b, and 6c are formed so as to be surrounded by the peripheral marginal area 5 and the non-chip area 5a. In each of the chip areas 6a, 6b, and 6c, a plurality of first division lines 8a intersect a plurality of second division lines 8b at right angles to form a plurality of chip forming portions 10 partitioned from each other. Each chip forming portion 10 is formed with a plurality of electrodes 12. A semiconductor chip is attached to the back side of each chip forming portion 10 by a DAF (Die Attach Film).

Figure 2:
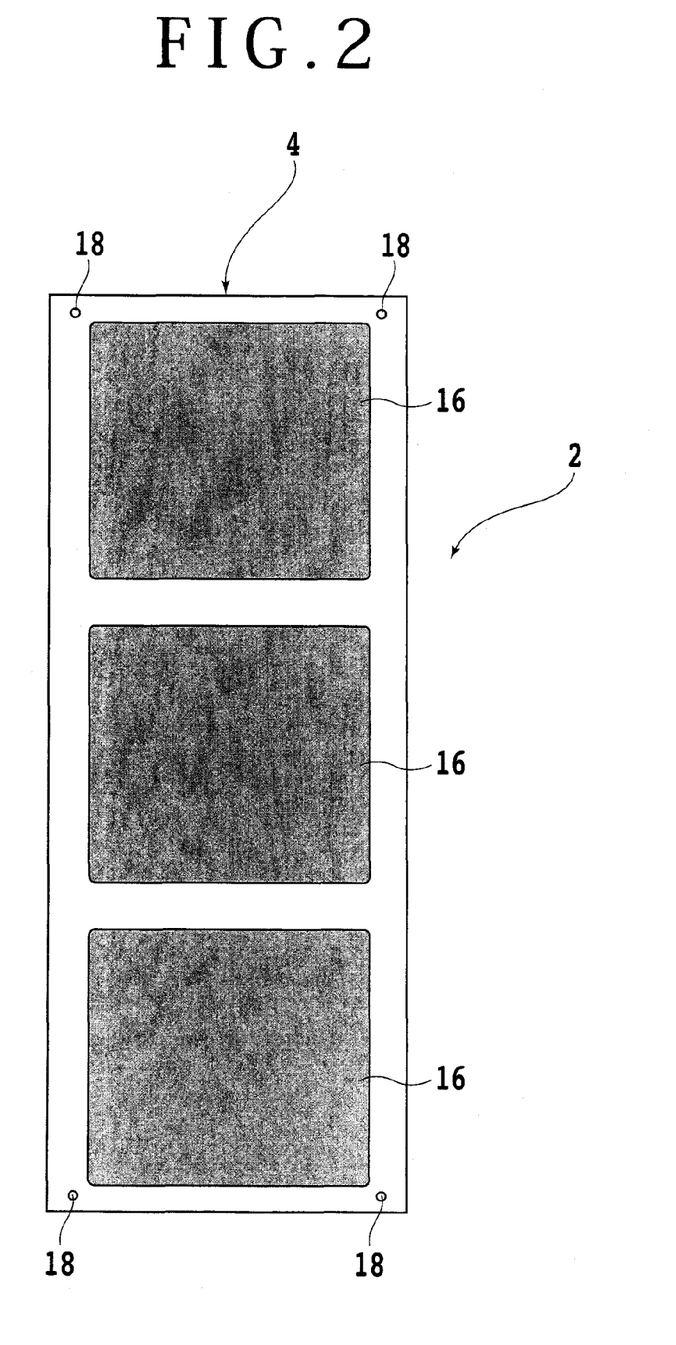
FIG. 2 is a bottom plan view of the CSP substrate shown in FIG. 1.

These electrodes 12 are insulated from each other by a resin molded on the metal frame 4. By cutting the metal frame 4 along the first and second division lines 8a and 8b, the electrodes 12 of each semiconductor chip appear on both sides of each of the first and second division lines 8a and 8b. Four round holes 18 are formed at the four corner portions of the metal frame 4. Referring to FIG. 2, there is shown the back side of the package substrate 2 shown in FIG. 1. The back side of each of the chip areas 6a, 6b, and 6c is covered with a mold resin 16.

Figure 3:
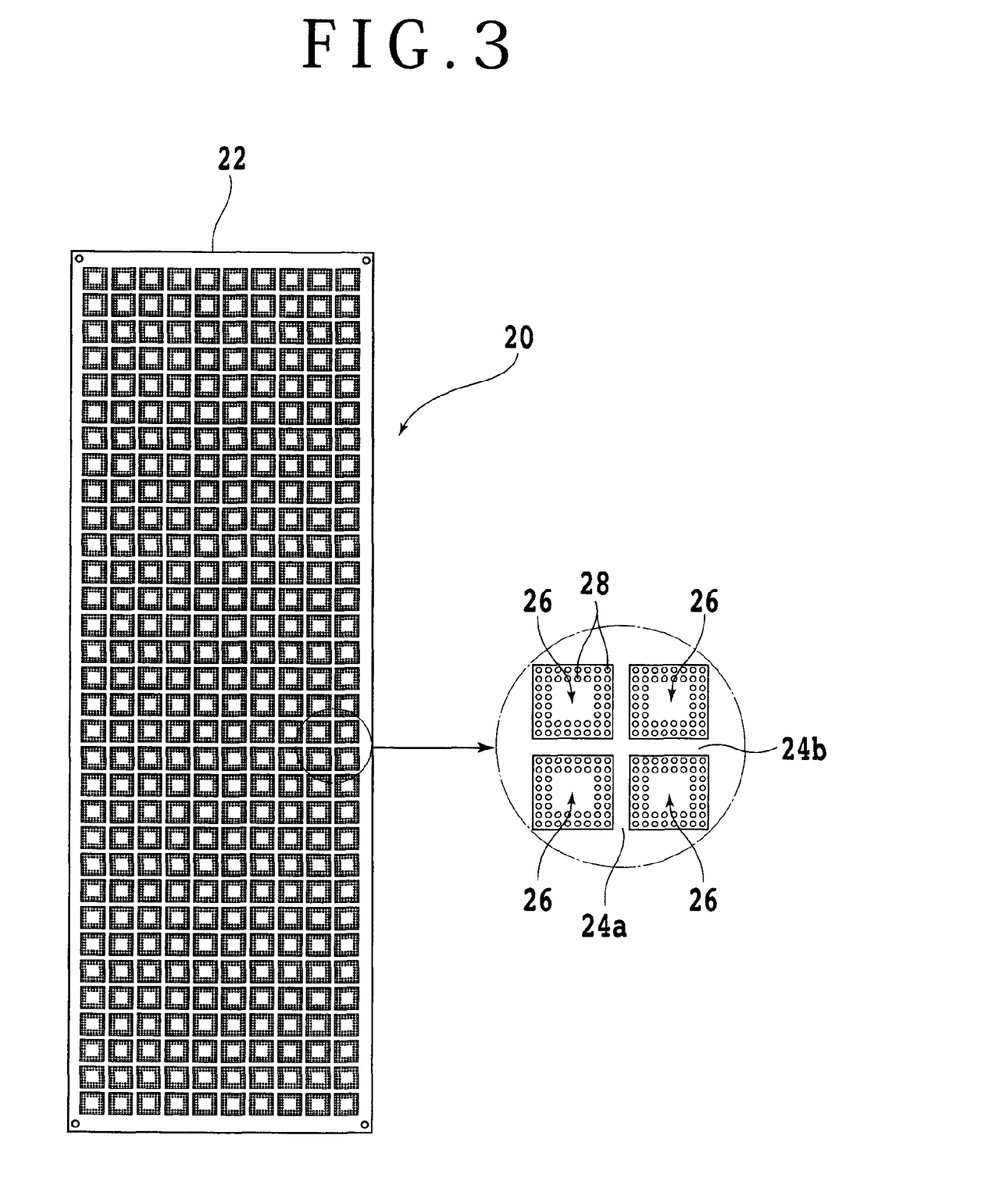
FIG. 3 is a top plan view of a BGA substrate as another example of the package substrate.
Figure 4:
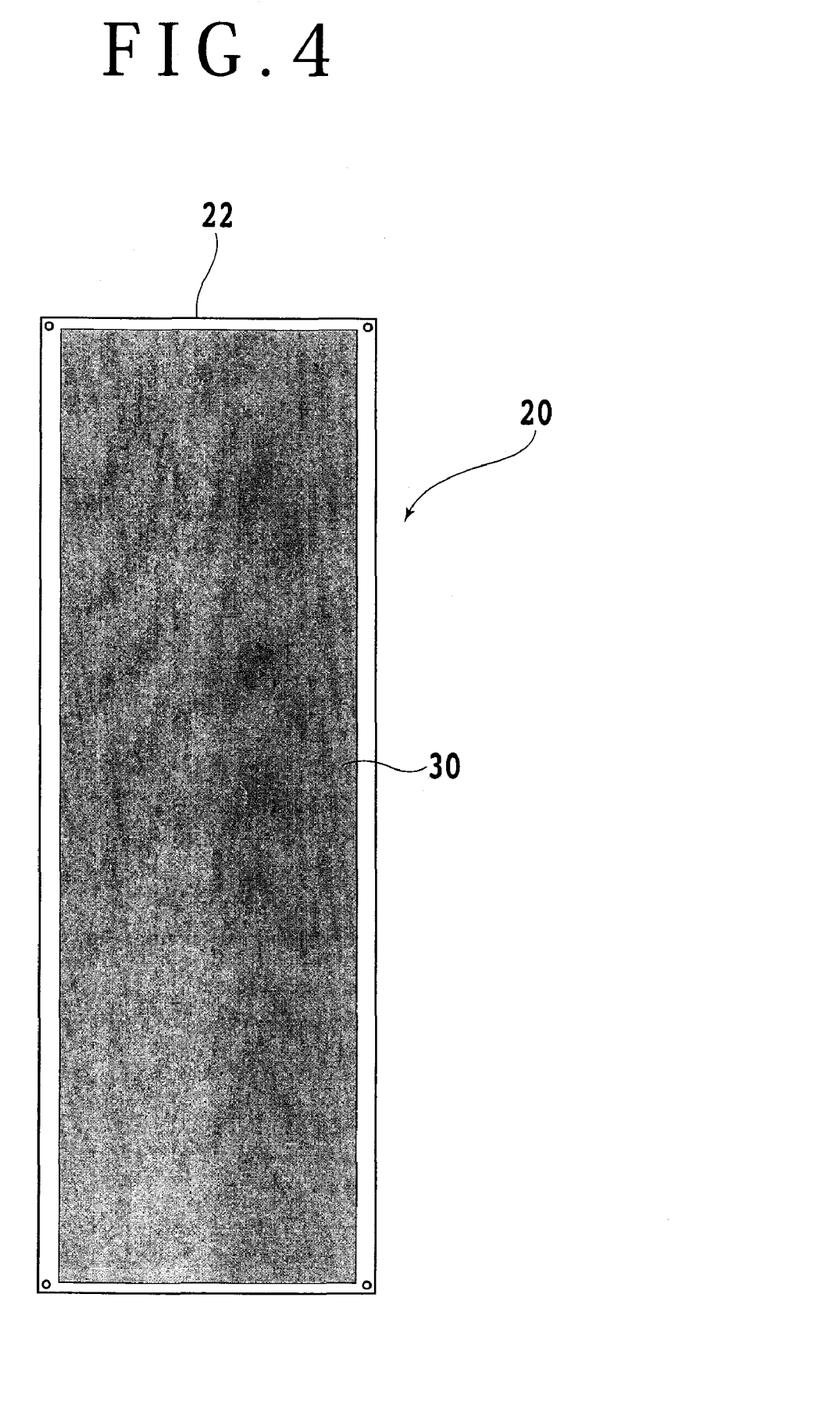
FIG. 4 is a bottom plan view of the BGA substrate shown in FIG. 3.

Referring next to FIG. 3, there is shown a plan view of another package substrate 20. The package substrate 20 is a BGA substrate, and it is composed of a resin substrate 22 and a plurality of semiconductor chips mounted on the resin substrate 22. As shown in an encircled portion in FIG. 3 as an enlarged view of a part of the package substrate 20, a plurality of first division lines 24a intersect a plurality of second division lines 24b at right angles to form a plurality of chip forming portions 26 partitioned from each other. A plurality of ball-shaped electrodes 28 are arranged along the four sides of each chip forming portion 26 so as to project from the front side thereof. Referring to FIG. 4, there is shown the back side of the package substrate 20 shown in FIG. 3. As shown in FIG. 4, the semiconductor chips mounted on the resin substrate 22 are covered with a mold resin 30.

In the package substrate 2 shown in FIGS. 1 and 2 and the package substrate 20 shown in FIGS. 3 and 4, warp generally occurs due to the influence of heat in molding the semiconductor chips with resin. There will now be described a package substrate processing method according to the present invention which can thinly process such a package substrate having a warp with reference to FIGS. 5 to 14.

Figure 5:
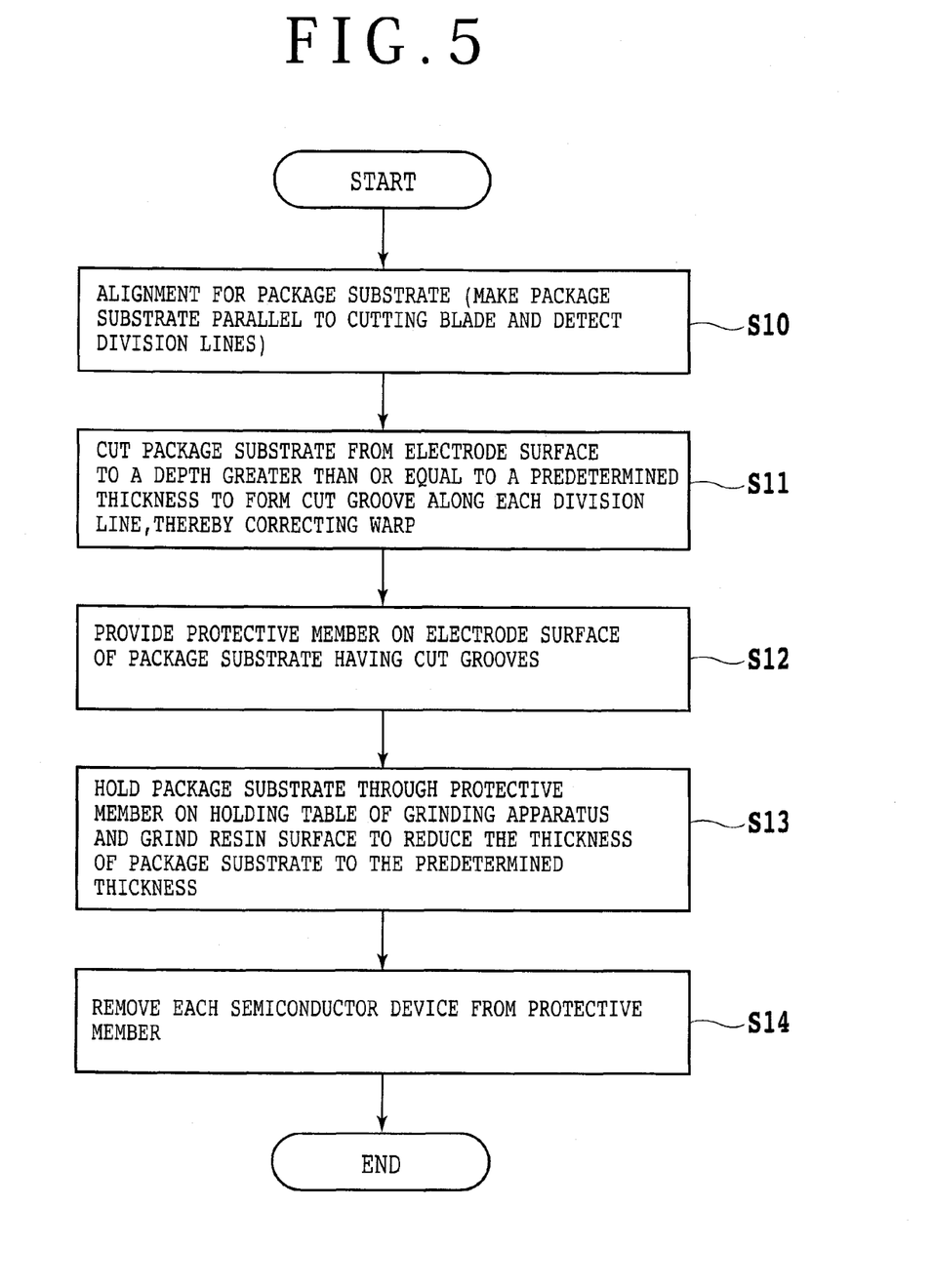
FIG. 5 is a flowchart showing a first preferred embodiment of the present invention, wherein the package substrate is cut from its electrode surface.

Referring to FIG. 5, there is shown a flowchart of a processing method according to a first preferred embodiment of the present invention, wherein the package substrate 2 is cut from its electrode side. In step S10, alignment for the package substrate 2 to be cut is performed. That is, the package substrate 2 is made parallel to a cutting blade in the direction of relative movement to detect the division lines 8a and 8b to be cut. After performing this alignment, the program proceeds to step S11, wherein a cutting blade 32 in a cutting apparatus is fed to cut into the package substrate 2 from an electrode surface 4a side to a depth greater than or equal to a predetermined thickness (finished thickness of each device) t1 as shown in FIG. 6 in the condition where a resin surface 16a of the mold resin 16 is held under suction on a holding table (not shown) in the cutting apparatus, thereby forming a plurality of cut grooves 34 along the division lines 8a and 8b to correct the warp of the package substrate 2 (warp correcting step).

Figure 6:
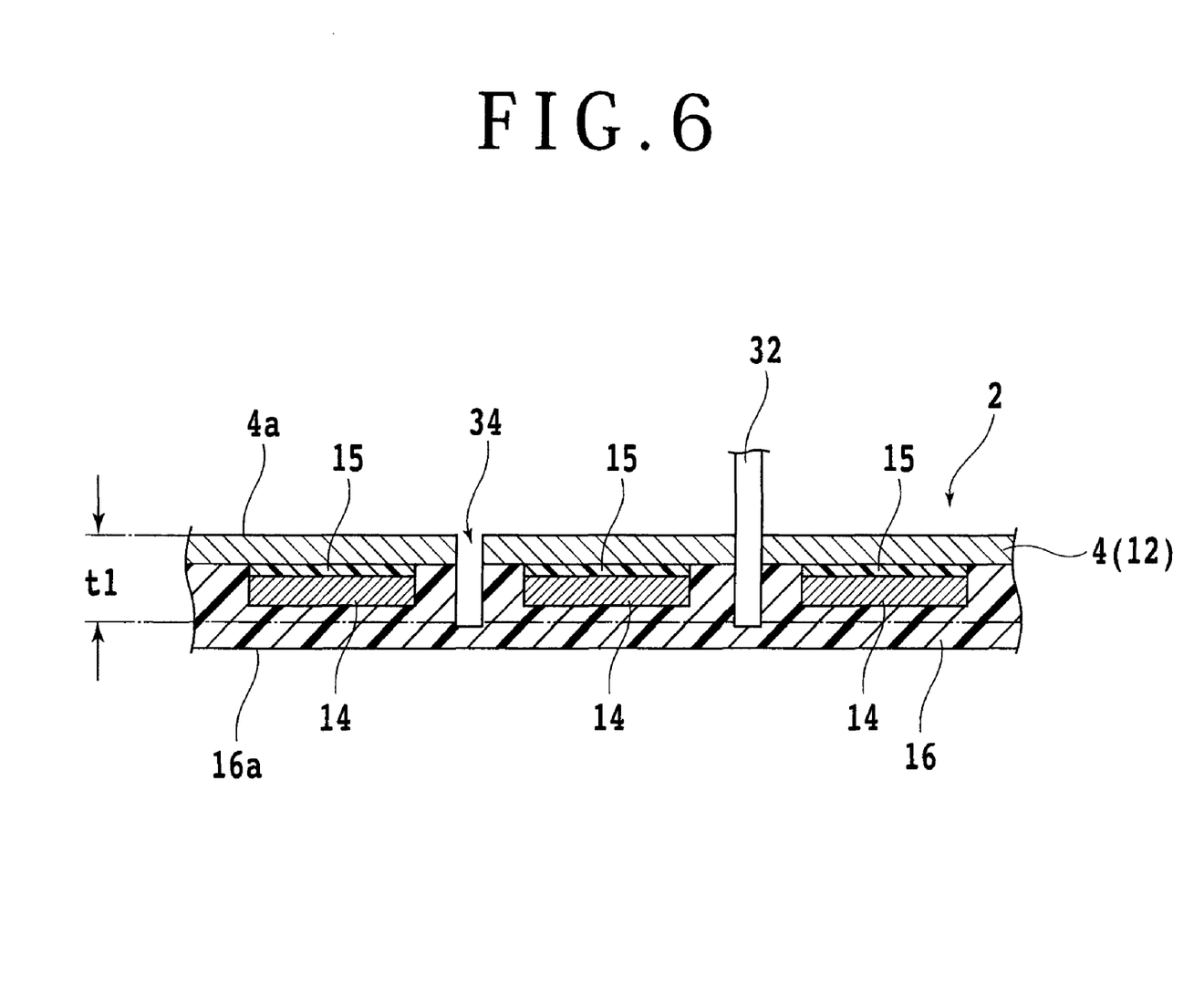
FIG. 6 is a sectional view showing a cutting step in the first preferred embodiment.
Figure 7:
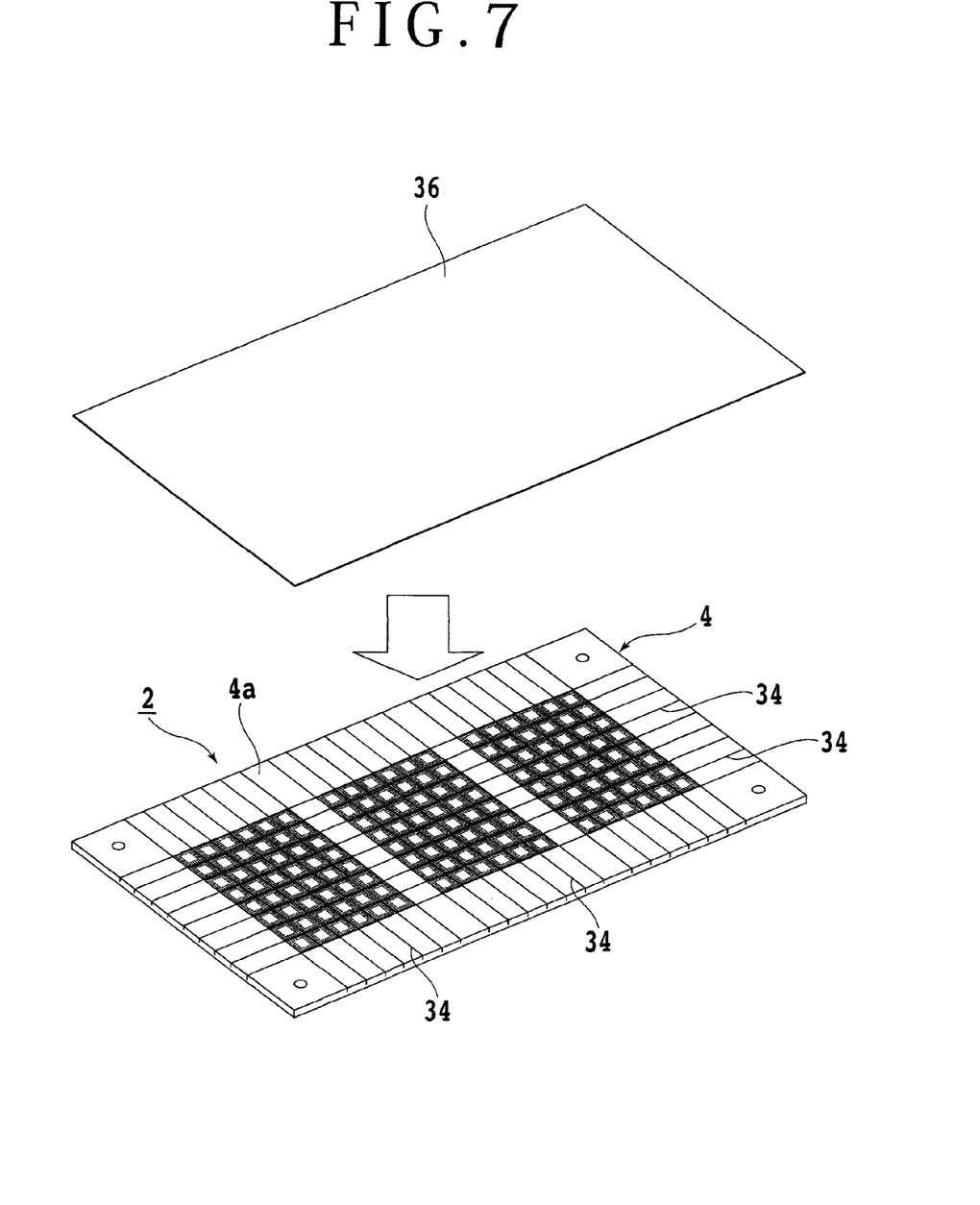
FIG. 7 is an exploded perspective view showing a protective member providing step in the first preferred embodiment.

In the warp correcting step shown in FIG. 6, the resin surface 16a of the mold resin 16 is directly held under suction on the holding table in the cutting apparatus to form the cut grooves 34. As a modification, an adhesive tape such as a dicing tape may be provided on the resin surface 16a of the mold resin 16. In this case, the cutting blade 32 may be allowed to cut into the package substrate 2 to a depth reaching the adhesive tape. That is, the package substrate 2 may be fully cut. After performing the warp correcting step, the program proceeds to step S12, wherein a protective member 36 such as a protective tape is provided on the electrode surface 4a of the package substrate 2 as shown in FIG. 7. In the case that the adhesive tape is attached to the resin surface 16a of the mold resin 16 as mentioned above, the adhesive tape is removed before or after performing the step S12.

Figure 8:
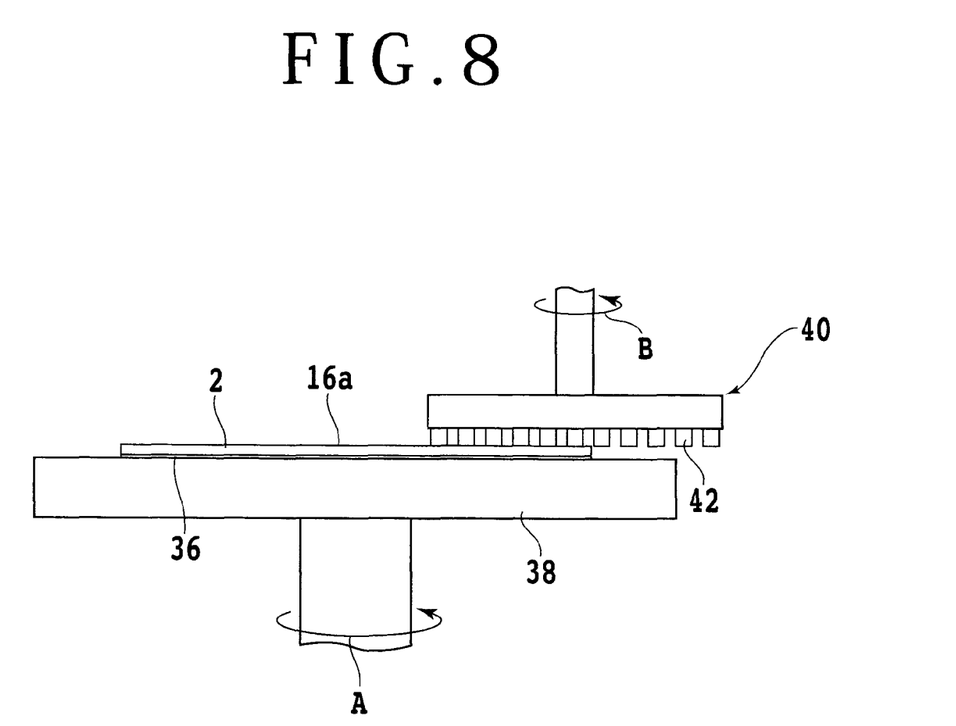
FIG. 8 is a side view showing a grinding step in the first preferred embodiment.

The program next proceeds to step S13, wherein the package substrate 2 is held under suction through the protective member 36 on a holding table 38 of a grinding apparatus as shown in FIG. 8 and the resin surface 16a of the package substrate 2 is ground to reduce the thickness of the package substrate 2 to the predetermined thickness t1. More specifically, the holding table 38 holding the package substrate 2 is rotated at 300 rpm, for example, in the direction shown by an arrow A in FIG. 8, and a grinding wheel 40 having a plurality of abrasive members 42 is rotated at 6000 rpm, for example, in the direction shown by an arrow B in FIG. 8. In this condition, the abrasive members 42 of the grinding wheel 40 is brought into contact with the resin surface 16a of the package substrate 2 to thereby grind the mold resin 16 so that the thickness of the package substrate 2 is reduced to the predetermined thickness t1. In the case that the package substrate 2 is not fully cut by the cutting blade 32 as shown in FIG. 6, the cut grooves 34 are exposed to the resin surface 16a by performing this grinding step, so that the package substrate 2 is divided into individual semiconductor devices 44.

Figure 9:
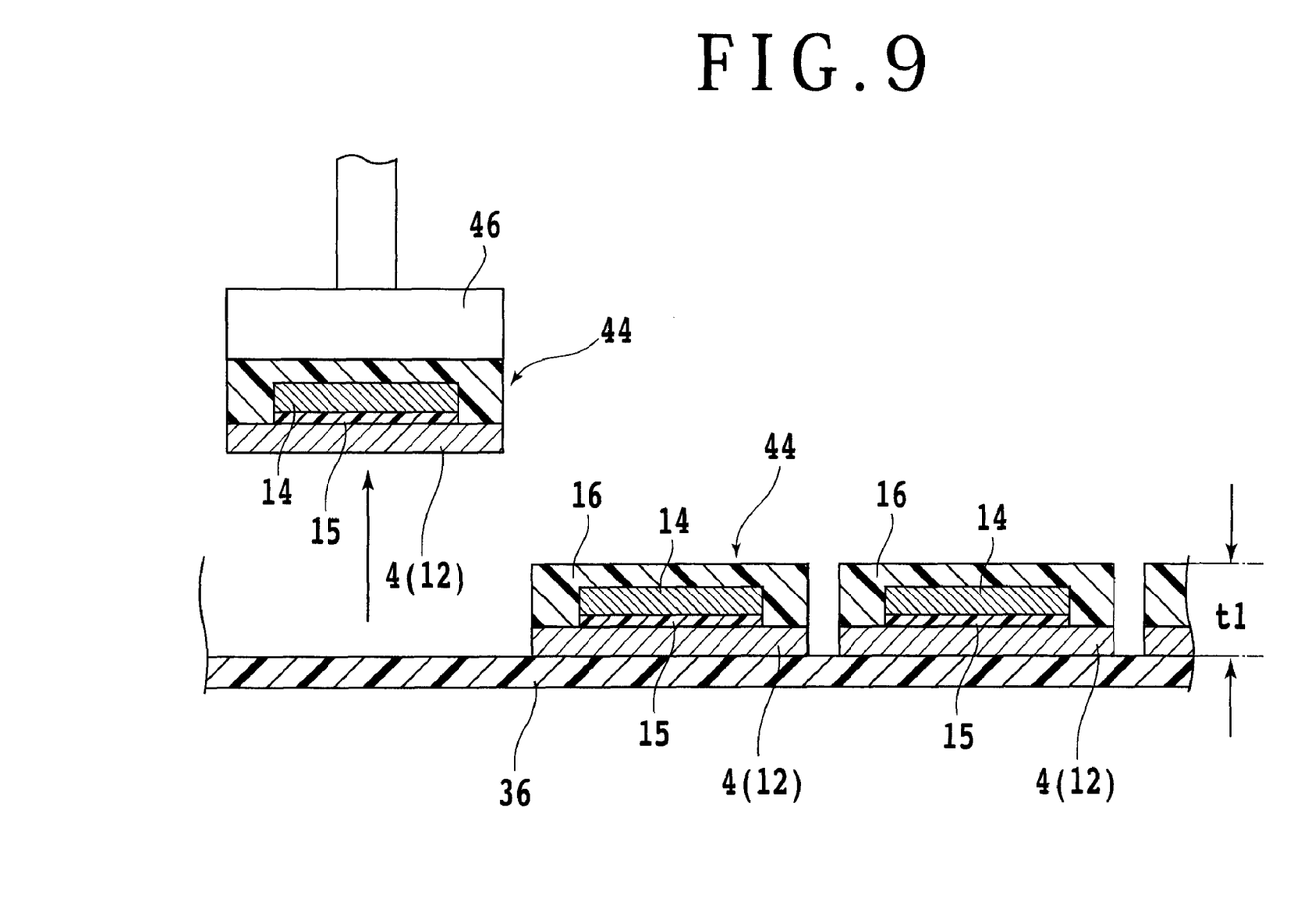
FIG. 9 is a sectional view showing a pickup step in the first preferred embodiment.

The program next proceeds to step S14, wherein each semiconductor device 44 is removed from the protective member 36. More specifically, as shown in FIG. 9, the semiconductor devices 44 divided from each other are individually picked up from the protective member 36 by using a pickup collet 46 of a pickup apparatus.

Figure 10:
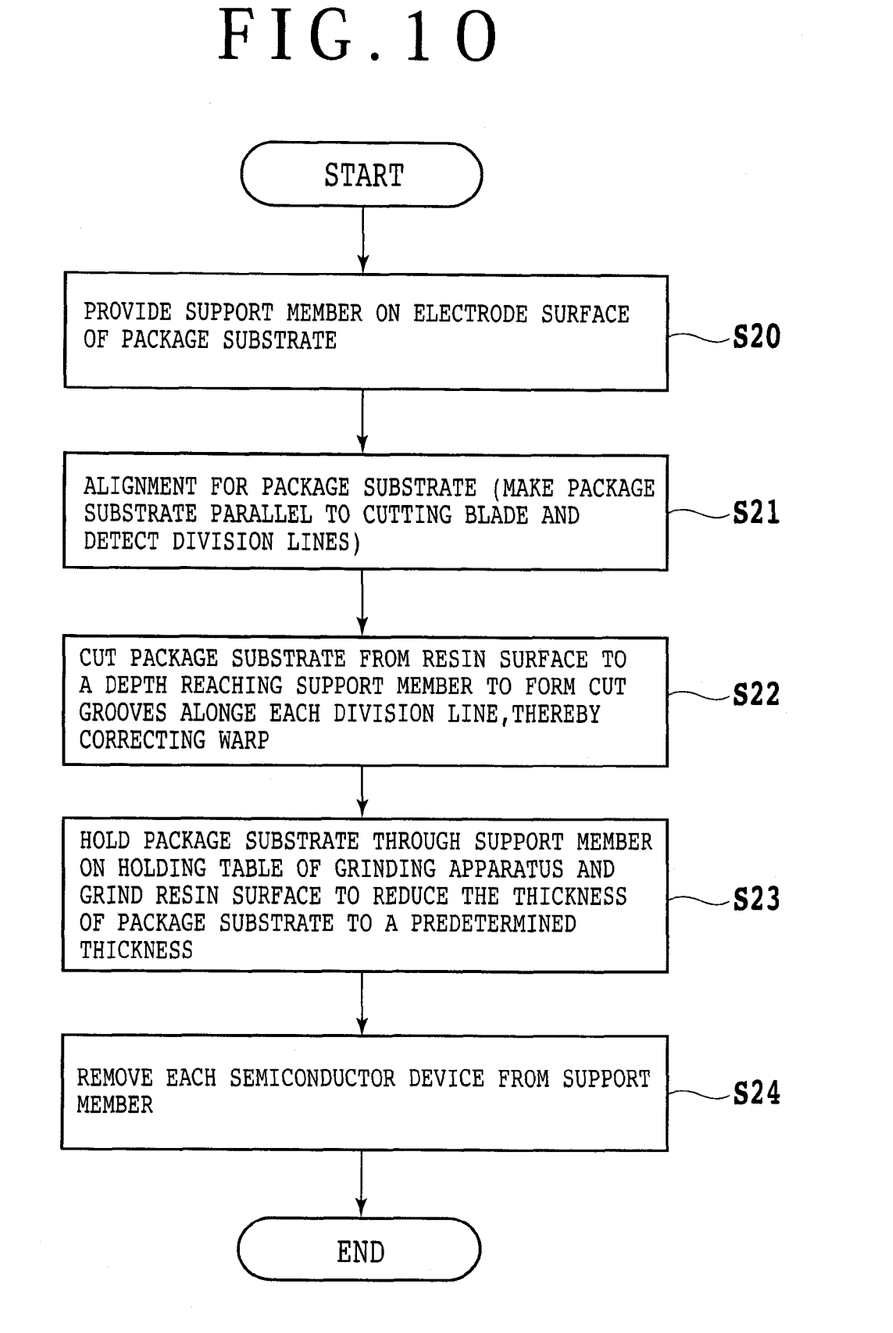
FIG. 10 is a flowchart showing a second preferred embodiment of the present invention, wherein the package substrate is cut from its resin surface.
Figure 11:
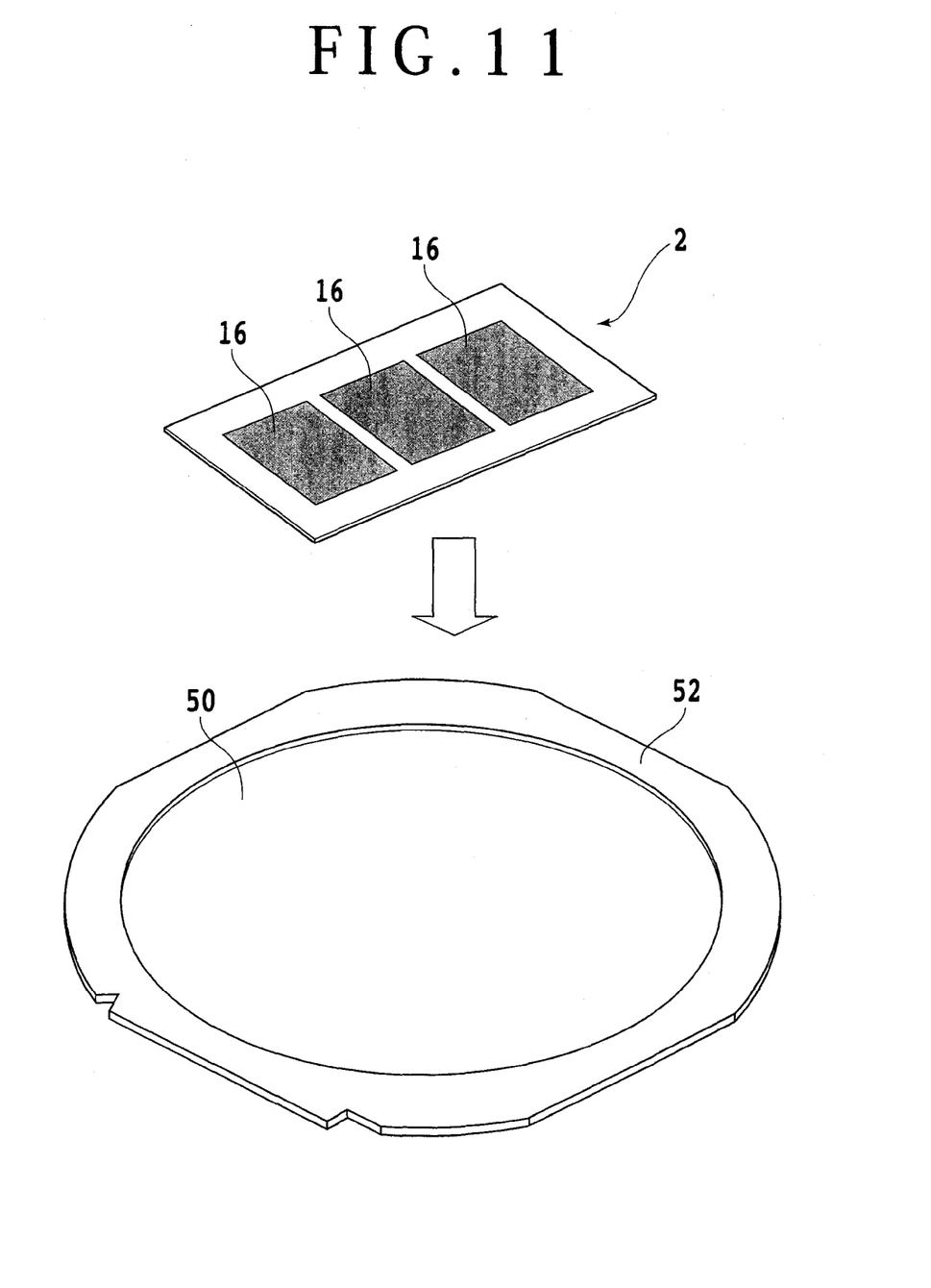
FIG. 11 is an exploded perspective view showing a support member providing step in the second preferred embodiment.

Referring next to FIG. 10, there is shown a flowchart of a processing method according to a second preferred embodiment of the present invention, wherein the package substrate 2 is cut from its resin side). In step S20, a support member is provided on the electrode surface 4a of the package substrate 2. More specifically, as shown in FIG. 11, the electrode surface 4a of the package substrate 2 is attached to an adhesive tape 50 such as a dicing tape supported at its outer circumferential portion to an annular frame 52. Accordingly, the package substrate 2 is supported through the adhesive tape 50 to the annular frame 52.

Figure 12:
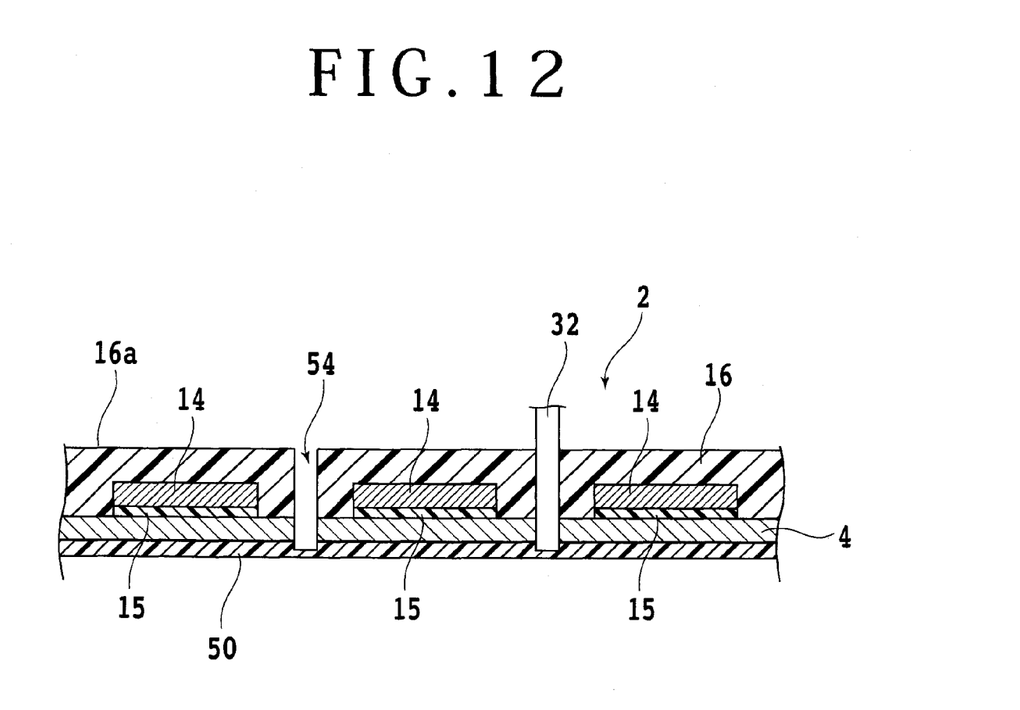
FIG. 12 is a sectional view showing a cutting step in the second preferred embodiment.

The program next proceeds to step S21, wherein alignment for the package substrate 2 is performed. That is, the package substrate 2 is made parallel to the cutting blade 32 in the direction of relative movement to detect the division lines 8a and 8b to be cut. This alignment is performed with reference to the round holes 18 formed at the four corner portions of the package substrate 2. The program next proceeds to step S22, wherein the cutting blade 32 is allowed to cut into the package substrate 2 from the resin surface 16a side to a depth reaching the adhesive tape 50 as the support member as shown in FIG. 12 in the condition where the adhesive tape 50 is held under suction on the holding table in the cutting apparatus, thereby forming a plurality of cut grooves 54 along the division lines 8a and 8b to correct the warp of the package substrate 2 (warp correcting step).

Figure 13:
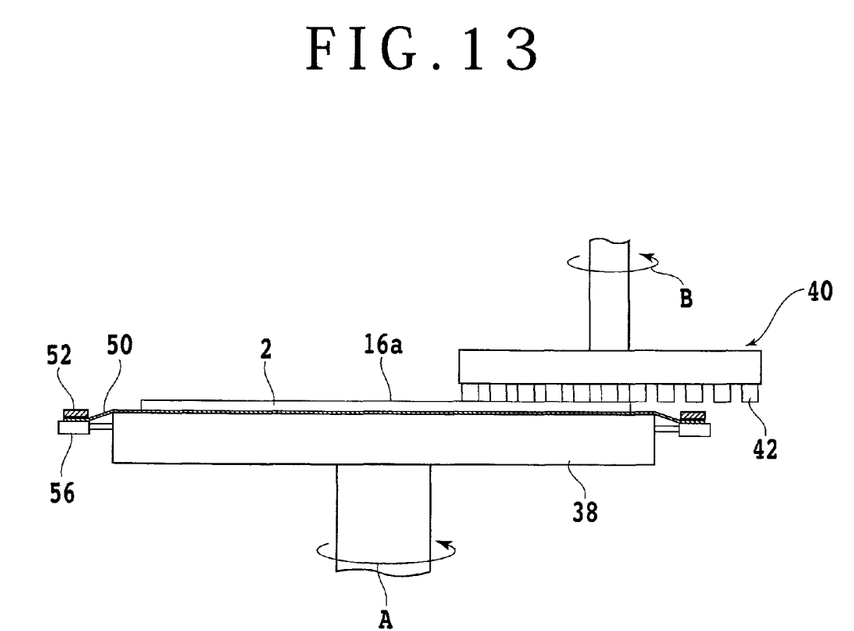
FIG. 13 is a side view showing a grinding step in the second preferred embodiment.

After performing the warp correcting step, the program proceeds to step S23, wherein a grinding step is performed to reduce the thickness of the package substrate 2 to the predetermined thickness t1. More specifically, as shown in FIG. 13, the package substrate 2 is held under suction through the adhesive tape 50 on the holding table 38 of the grinding apparatus in the condition where the annular frame 52 is fixed by a frame fixing member 56 such as a permanent magnet. In this condition, the holding table 38 is rotated at 300 rpm, for example, in the direction shown by an arrow A in FIG. 13, and the grinding wheel 40 is rotated at 6000 rpm, for example, in the direction shown by an arrow B in FIG. 13. In this condition, the abrasive members 42 of the grinding wheel 40 is brought into contact with the resin surface 16a of the package substrate 2 to thereby grind the mold resin 16 so that the thickness of the package substrate 2 is reduced to the predetermined thickness t1.

Figure 14:
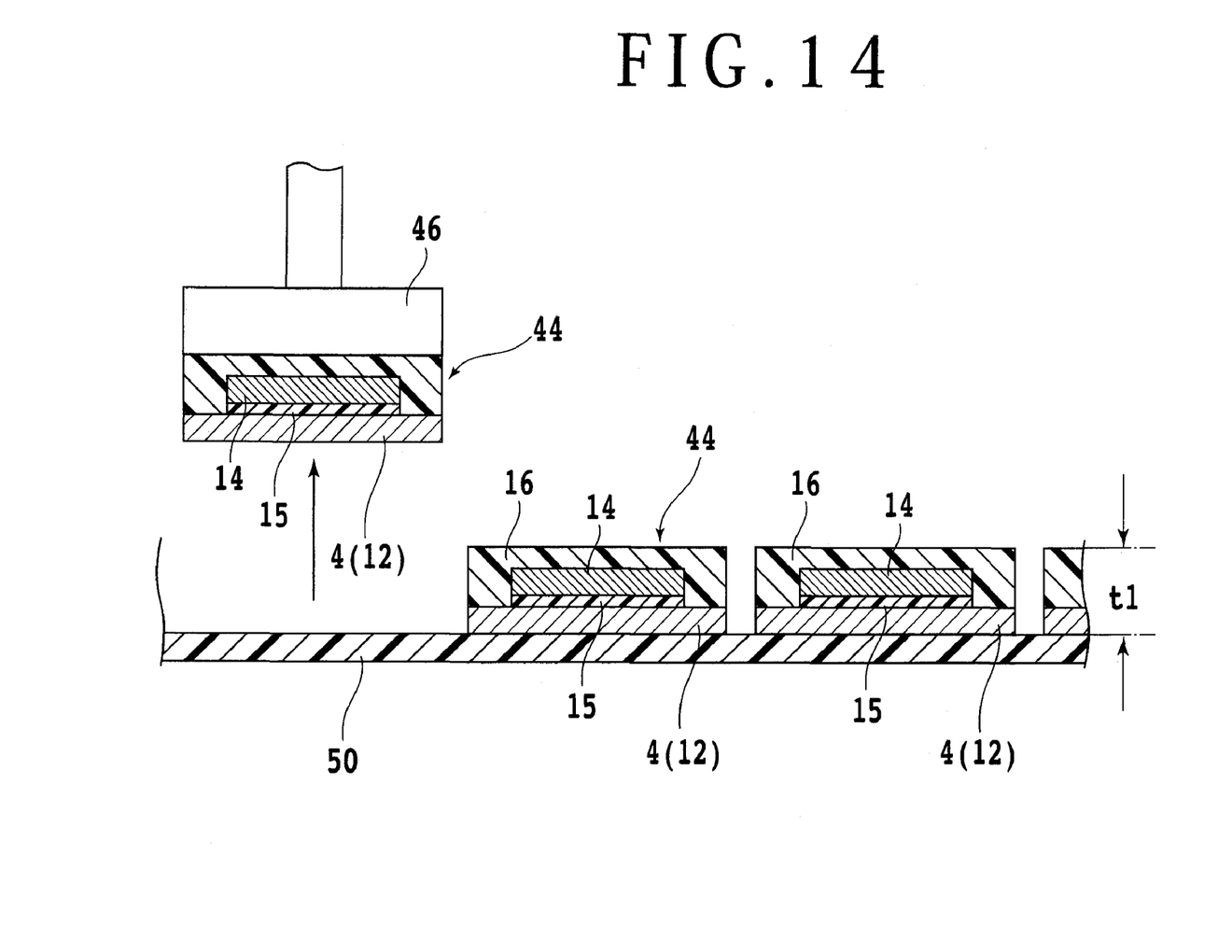
FIG. 14 is a sectional view showing a pickup step in the second preferred embodiment.

After performing this grinding step, the program proceeds to step S24, wherein each semiconductor device 44 is removed from the support member (the adhesive tape 50). More specifically, as shown in FIG. 14, the semiconductor devices 44 divided from each other are individually picked up from the adhesive tape 50 by using the pickup collet 46 of the pickup apparatus.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for a package substrate having a base substrate partitioned by a plurality of crossing division lines to form a plurality of chip forming areas where a plurality of semiconductor chips are respectively formed and molded with resin, said package substrate having a resin surface on the mold resin and an electrode surface on the base substrate opposite to said resin surface, said processing method comprising:
    a warp correcting step of cutting said package substrate from said resin surface or said electrode surface through the base substrate and at least a portion of the mold resin along said division lines by using a cutting blade to form a cut groove, thereby correcting a warp of said package substrate; and
    a grinding step of grinding said resin surface of said package substrate in the condition where said electrode surface of said package substrate is held on a holding table after performing said warp correcting step, thereby reducing the thickness of said package substrate to a predetermined thickness and divide said package substrate into the plurality of semiconductor chips.

2. The processing method for a package substrate according to claim 1, wherein said warp correcting step includes the step of cutting said package substrate from said electrode surface along said division lines by using said cutting blade to form said cut groove having a depth corresponding to said predetermined thickness.

3. The processing method for a package substrate according to claim 1, further comprising a support member providing step of providing a support member on said electrode surface of said package substrate before performing said warp correcting step, wherein said warp correcting step includes the step of cutting said package substrate from said resin surface along said division lines by using said cutting blade to form said cut groove having a depth reaching said support member.

* * * * *